하지 않음

(12) United States Patent
Tivarus et al.

(10) Patent No.: US 8,471,939 B2
(45) Date of Patent: Jun. 25, 2013

(54) IMAGE SENSOR HAVING MULTIPLE SENSING LAYERS

(75) Inventors: Cristian A. Tivarus, Rochester, NY (US); John P. McCarten, Penfield, NY (US); Joseph R. Summa, Hilton, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 734 days.

(21) Appl. No.: 12/184,314

(22) Filed: Aug. 1, 2008

(65) Prior Publication Data

US 2010/0026865 A1 Feb. 4, 2010

(51) Int. Cl.
H04N 3/14 (2006.01)
H04N 5/335 (2006.01)

(52) U.S. Cl.
USPC ............................. 348/308; 348/294; 348/300

(58) Field of Classification Search
None
See application file for complete search history.

(56) References Cited

U.S. PATENT DOCUMENTS

| | | | |
|---|---|---|---|
| 4,438,455 A * | 3/1984 | Tabei | 348/280 |
| 4,677,289 A * | 6/1987 | Nozaki et al. | 250/226 |
| 5,189,500 A | 2/1993 | Kusunoki | |
| 6,281,561 B1 * | 8/2001 | Stiebig et al. | 257/440 |
| 6,924,167 B1 * | 8/2005 | Hopper et al. | 438/57 |
| 6,954,230 B2 | 10/2005 | Monoi | |
| 7,214,999 B2 | 5/2007 | Holm et al. | |
| 7,218,347 B2 * | 5/2007 | Shinohara | 348/272 |
| 7,339,216 B1 * | 3/2008 | Lyon et al. | 257/291 |
| 7,755,016 B2 * | 7/2010 | Toda et al. | 250/208.1 |
| 2002/0033892 A1 | 3/2002 | Monoi | |
| 2003/0209652 A1 | 11/2003 | Fujii et al. | |
| 2004/0125222 A1 * | 7/2004 | Bradski et al. | 348/272 |
| 2004/0169752 A1 * | 9/2004 | Stark | 348/302 |
| 2004/0259010 A1 * | 12/2004 | Kanbe | 430/67 |
| 2005/0109917 A1 * | 5/2005 | Wong | 250/208.1 |
| 2005/0139828 A1 | 6/2005 | Maruyama et al. | |

(Continued)

FOREIGN PATENT DOCUMENTS

EP 1 628 348 A1 2/2006
FR 2 888 989 A 1/2007

(Continued)

OTHER PUBLICATIONS

PCT/US2009/004051, PCT International Search Report, mail date Nov. 4, 2009, 5 pages.

(Continued)

*Primary Examiner* — Sinh Tran
*Assistant Examiner* — Jason Flohre
(74) *Attorney, Agent, or Firm* — Blakely Sokoloff Taylor & Zafman LLP

(57) ABSTRACT

An image sensor includes a first sensor layer having a first array of pixels and a second sensor layer having a second array of pixels. Each pixel of the first and second arrays has a photodetector for collecting charge in response to incident light, a charge-to-voltage conversion mechanism, and a transfer gate for selectively transferring charge from the photodetector to the charge-to-voltage mechanism. The first and second sensor layers each have a thicknesses to collect light with a first and second preselected ranges of wavelengths, respectively. A circuit layer is situated below the first sensor layer and has support circuitry for the pixels of the first and second sensor layers, and interlayer connectors are between the pixels of the first and second layers and the support circuitry.

23 Claims, 11 Drawing Sheets

U.S. PATENT DOCUMENTS

| | | | |
|---|---|---|---|
| 2005/0205901 A1 | 9/2005 | Suzuki | |
| 2006/0175536 A1* | 8/2006 | Kim et al. | 250/208.1 |
| 2007/0018075 A1 | 1/2007 | Cazaux et al. | |
| 2007/0024931 A1 | 2/2007 | Compton et al. | |
| 2007/0052051 A1* | 3/2007 | Osaka et al. | 257/440 |
| 2007/0069258 A1* | 3/2007 | Ahn | 257/290 |
| 2007/0246756 A1* | 10/2007 | Mouli | 257/292 |
| 2007/0279661 A1 | 12/2007 | Misawa | |
| 2008/0083939 A1 | 4/2008 | Guidash | |
| 2008/0203452 A1* | 8/2008 | Moon et al. | 257/292 |
| 2008/0303072 A1* | 12/2008 | Lee et al. | 257/292 |
| 2009/0200584 A1* | 8/2009 | Tweet et al. | 257/292 |
| 2009/0294813 A1* | 12/2009 | Gambino et al. | 257/292 |

FOREIGN PATENT DOCUMENTS

| | | |
|---|---|---|
| JP | 10 284714 A | 10/1998 |
| JP | 2001339057 A | 12/2001 |
| WO | WO 2007/105478 A1 | 9/2007 |

OTHER PUBLICATIONS

PCT/US2009/004051, International Preliminary Report on Patentability and Written Opinion, date of issuance Feb. 1, 2011, 9 pages.

CN 200980127273.X—First Office Action w/ English Translation, issued Aug. 31, 2012 (59 pages).

* cited by examiner

IMAGE SENSOR HAVING MULTIPLE SENSING LAYERS

FIELD OF THE INVENTION

The invention relates generally to the field of image sensors, and more particularly to a stacked image sensor construction.

BACKGROUND OF THE INVENTION

A typical Complementary Metal Oxide Semiconductor (CMOS) image sensor has an image sensing portion that includes a photodiode for collecting charge in response to incident light and a transfer gate for transferring charge from the photodiode to a charge-to-voltage conversion mechanism, such as a floating diffusion. Usually, the sensing portion is fabricated within the same material layer and with similar processes as the control circuitry for the image sensor. In an effort to increase the number of pixels provided in an image sensor, pixel size has been decreasing.

However, as the pixel size shrinks, the illuminated area of the photodetector is also typically reduced, in turn decreasing the captured signal level and degrading performance.

Thus, a need exists for an improved image sensor structure.

SUMMARY OF THE INVENTION

An image sensor includes a first sensor layer having a first array of pixels. Each pixel of the first array has a photodetector for collecting charge in response to incident light, a charge-to-voltage conversion mechanism, and a transfer gate for selectively transferring charge from the photodetector to the charge-to-voltage mechanism. The first sensor layer has a thickness to collect light with a first preselected range of wavelengths. A second sensor is layer situated over the first sensor layer, and has a second array of pixels. Each pixel includes a photodetector for collecting charge in response to incident light, a charge-to-voltage conversion, and a transfer gate for selectively transferring charge from the photodetector to the charge-to-voltage mechanism. The second sensor layer has a thickness to collect light with a second preselected range of wavelengths. A circuit layer is situated below the first sensor layer and has support circuitry for the pixels of the first and second sensor layers, and interlayer connectors are between the pixels of the first and second layers and the support circuitry.

The present invention has the advantage of providing an improved image sensor structure.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION OF THE INVENTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
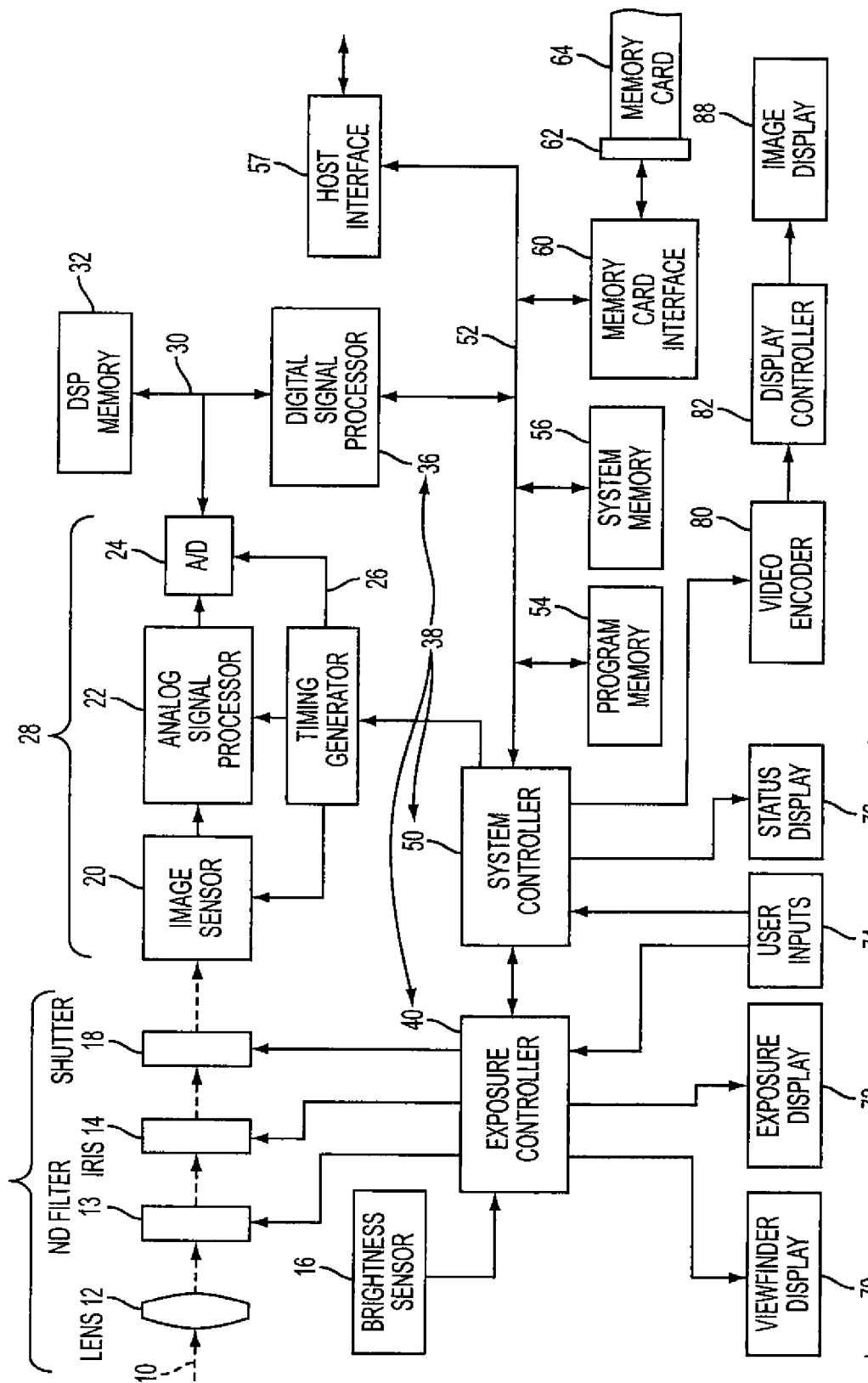
FIG. 1 is a block diagram illustrating aspects of an embodiment of a digital camera.

Turning now to FIG. 1, a block diagram of an image capture device shown as a digital camera embodying aspects of the present disclosure is illustrated. Although a digital camera is illustrated and described, the present invention is clearly applicable to other types of image capture devices. In the disclosed camera, light 10 from a subject scene is input to an imaging stage 11, where the light is focused by a lens 12 to form an image on an image sensor 20. The image sensor 20 converts the incident light to an electrical signal for each picture element (pixel). In some embodiments, the image sensor 20 is an active pixel sensor (APS) type (APS devices are often referred to as CMOS sensors because of the ability to fabricate them in a Complementary Metal Oxide Semiconductor process).

The amount of light reaching the sensor 20 is regulated by an iris block 14 that varies the aperture and the neutral density (ND) filter block 13 that includes one or more ND filters interposed in the optical path. Also regulating the overall light level is the time that the shutter block 18 is open. The exposure controller block 40 responds to the amount of light available in the scene as metered by the brightness sensor block 16 and controls all three of these regulating functions.

This description of a particular camera configuration will be familiar to one skilled in the art, and it will be apparent to such a skilled person that many variations and additional features are present. For example, an autofocus system is added, or the lens is detachable and interchangeable. It will be understood that the present disclosure applies to various types of digital cameras where similar functionality is provided by alternative components. For example, the digital camera is a relatively simple point and shoot digital camera, where the shutter 18 is a relatively simple movable blade shutter, or the like, instead of the more complicated focal plane arrangement. Aspects of the present invention can also be practiced on imaging components included in non-camera devices such as mobile phones and automotive vehicles.

An analog signal from the image sensor 20 is processed by an analog signal processor 22 and applied to an analog to digital (A/D) converter 24. A timing generator 26 produces various clocking signals to select rows and pixels and synchronizes the operation of the analog signal processor 22 and the A/D converter 24. The image sensor stage 28 includes the image sensor 20, the analog signal processor 22, the A/D converter 24, and the timing generator 26. The components of the image sensor stage 28 can be separately fabricated integrated circuits, or they could be fabricated as a single integrated circuit as is commonly done with CMOS image sensors. The resulting stream of digital pixel values from the A/D converter 24 is stored in a memory 32 associated with the digital signal processor (DSP) 36.

The digital signal processor 36 is one of three processors or controllers in the illustrated embodiment, in addition to a system controller 50 and an exposure controller 40. Although this partitioning of camera functional control among multiple controllers and processors is typical, these controllers or processors are combined in various ways without affecting the functional operation of the camera and the application of the present invention. These controllers or processors can comprise one or more digital signal processor devices, microcontrollers, programmable logic devices, or other digital logic circuits. Although a combination of such controllers or processors has been described, it should be apparent that one controller or processor can be designated to perform all of the needed functions. All of these variations can perform the same function and fall within the scope of this invention, and the term "processing stage" will be used as needed to encompass all of this functionality within one phrase, for example, as in processing stage 38 in FIG. 1.

In the illustrated embodiment, the DSP 36 manipulates the digital image data in its memory 32 according to a software program permanently stored in program memory 54 and copied to the memory 32 for execution during image capture. The DSP 36 executes the software necessary for practicing image processing. The memory 32 includes of any type of random access memory, such as SDRAM. A bus 30 comprising a pathway for address and data signals connects the DSP 36 to its related memory 32, A/D converter 24 and other related devices.

The system controller 50 controls the overall operation of the camera based on a software program stored in the program memory 54, which can include Flash EEPROM or other nonvolatile memory. This memory can also be used to store image sensor calibration data, user setting selections and other data which must be preserved when the camera is turned off. The system controller 50 controls the sequence of image capture by directing the exposure controller 40 to operate the lens 12, ND filter 13, iris 14, and shutter 18 as previously described, directing the timing generator 26 to operate the image sensor 20 and associated elements, and directing the DSP 36 to process the captured image data. After an image is captured and processed, the final image file stored in memory 32 is transferred to a host computer via an interface 57, stored on a removable memory card 64 or other storage device, and displayed for the user on an image display 88.

A bus 52 includes a pathway for address, data and control signals, and connects the system controller 50 to the DSP 36, program memory 54, system memory 56, host interface 57, memory card interface 60 and other related devices. The host interface 57 provides a high speed connection to a personal computer (PC) or other host computer for transfer of image data for display, storage, manipulation or printing. This interface is an IEEE1394 or USB2.0 serial interface or any other suitable digital interface The memory card 64 is typically a Compact Flash (CF) card inserted into a socket 62 and connected to the system controller 50 via a memory card interface 60. Other types of storage that are utilized include, for example, PC-Cards, MultiMedia Cards (MMC), or Secure Digital (SD) cards.

Processed images are copied to a display buffer in the system memory 56 and continuously read out via a video encoder 80 to produce a video signal. This signal is output directly from the camera for display on an external monitor, or processed by the display controller 82 and presented on an image display 88. This display is typically an active matrix color liquid crystal display (LCD), although other types of displays are used as well.

The user interface, including all or any combination of viewfinder display 70, exposure display 72, status display 76 and image display 88, and user inputs 74, is controlled by a combination of software programs executed on the exposure controller 40 and the system controller 50. User inputs 74 typically include some combination of buttons, rocker switches, joysticks, rotary dials or touchscreens. The exposure controller 40 operates light metering, exposure mode, autofocus and other exposure functions. The system controller 50 manages the graphical user interface (GUI) presented on one or more of the displays, for example, on the image display 88. The GUI typically includes menus for making various option selections and review modes for examining captured images.

The exposure controller 40 accepts user inputs selecting exposure mode, lens aperture, exposure time (shutter speed), and exposure index or ISO speed rating and directs the lens and shutter accordingly for subsequent captures. The brightness sensor 16 is employed to measure the brightness of the scene and provide an exposure meter function for the user to refer to when manually setting the ISO speed rating, aperture and shutter speed. In this case, as the user changes one or more settings, the light meter indicator presented on viewfinder display 70 tells the user to what degree the image will be over or underexposed. In an automatic exposure mode, the user changes one setting and the exposure controller 40 automatically alters another setting to maintain correct exposure. For example, for a given ISO speed rating when the user reduces the lens aperture, the exposure controller 40 automatically increases the exposure time to maintain the same overall exposure.

Figure 2:
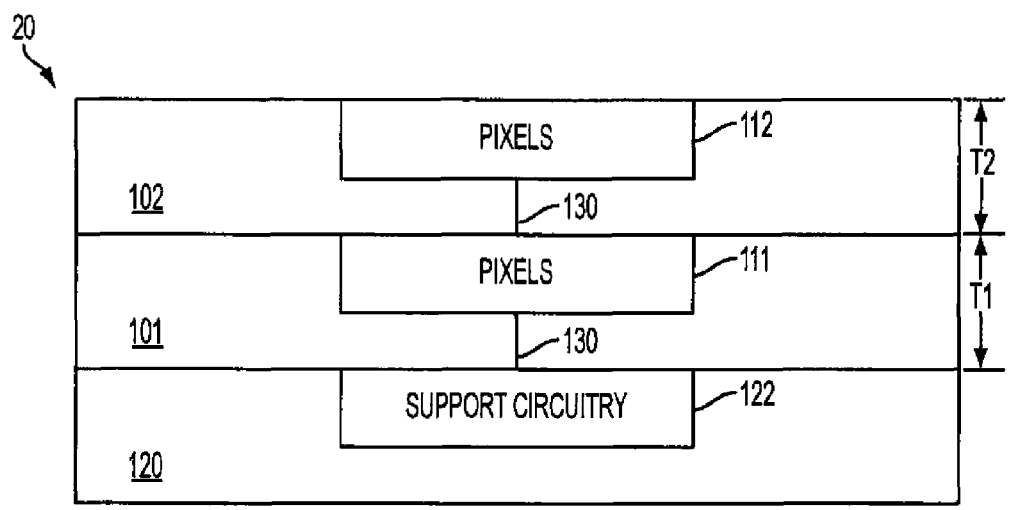
FIG. 2 is a block diagram conceptually illustrating an embodiment of an image sensor.

The image sensor 20 shown in FIG. 1 typically includes a two-dimensional array of light sensitive pixels fabricated on a silicon substrate that provide a way of converting incoming light at each pixel into an electrical signal that is measured. Referring to FIG. 2, portions of an embodiment of the image sensor 20 are conceptually illustrated.

In FIG. 2, the image sensor 20 is a Complementary Metal Oxide Semiconductor (CMOS) image sensor that includes a first sensor layer 101 having a first array of pixels 111. A second sensor layer 102 is situated over the first sensor layer 101, which has a second array of pixels 112. A circuit layer 120 is situated below the first sensor layer 101, with support circuitry 122 for the pixel arrays 111, 112 of the first and second sensor layers 101, 102. Interlayer connectors 130 between the pixels 111,112 of the first and second layers 101,102 and the support circuitry 122 provide electrical connections between the respective layers. The first sensor layer 101 has a thickness T1 to collect light with a first preselected range of wavelengths and the second sensor layer has a thickness T2 to collect light with a second preselected range of wavelengths. Regular silicon wafers, silicon on insulator (SOI) wafers or silicon on sapphire (SOS) wafers are all suitable materials for manufacture of the sensor layers 101, 102.

Figure 3:
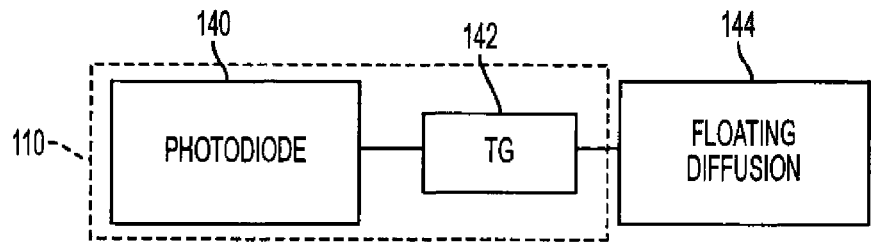
FIG. 3 is a block diagram illustrating portions of a pixel.

FIG. 3 is a block diagram conceptually portions of a pixel 110 of the pixel arrays 111, 112. The pixel 110 includes a photodetector, such as a photodiode 140 and a transfer mechanism, such as a transfer gate 142. The photodetector 140 collects charge in response to incident light and the transfer gate 142 functions to transfer charge from the photodetector 140 to a charge-to-voltage mechanism, such as a floating diffusion sense node 144, which receives the charge from the photodetector 140 and converts the charge to a voltage signal. As noted above, the pixels 110 are typically configured in arrays of rows and columns. A row select transistor is coupled to a column bus, and the readout of charge from the pixels 110 is accomplished by selecting the desired row of the array by activating the proper row select transistor, and the information is read out from the columns of the selected row.

Figures 4A, 4B:
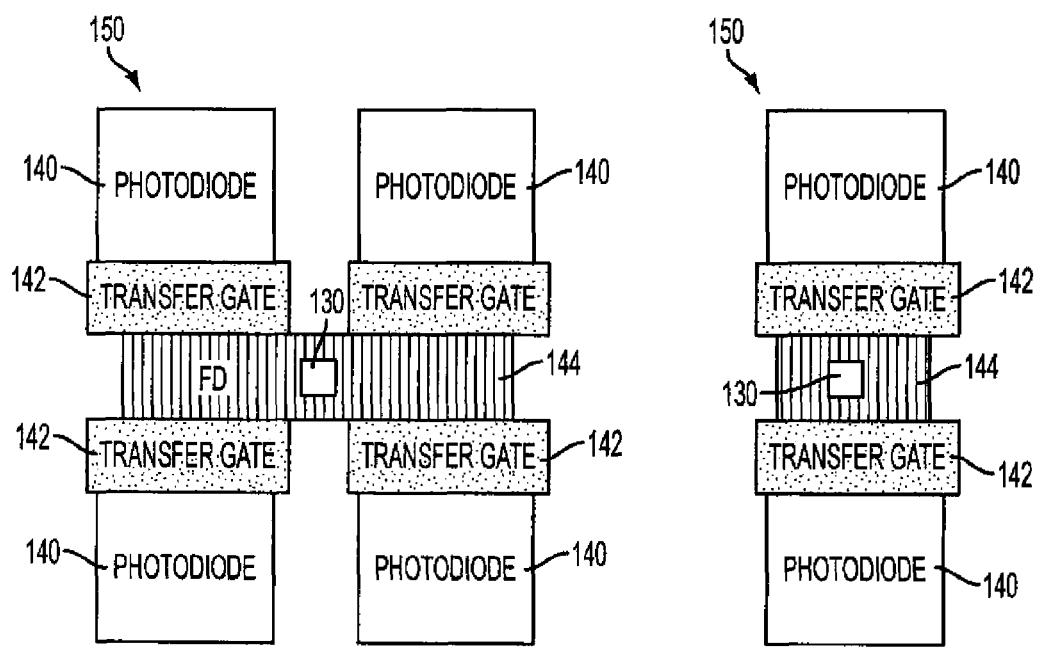
FIGS. 4A and 4B illustrate examples of embodiments of pixel kernel configurations.

In some embodiments, the pixels 110 of the first and second pixel arrays 111,112 are organized into pixel kernels 150. FIGS. 4A and 4B illustrate examples of some pixel kernel configurations. In FIG. 4A, four photodiodes 140 share a common floating diffusion 144 via respective transfer gates 142, and in FIG. 4B, two photodiodes 140 share a common floating diffusion 144. In the embodiments illustrated in FIGS. 4A and 4B, the interlayer connectors 130 are coupled to the floating diffusions 144 of the pixel kernels 150.

Figure 5:
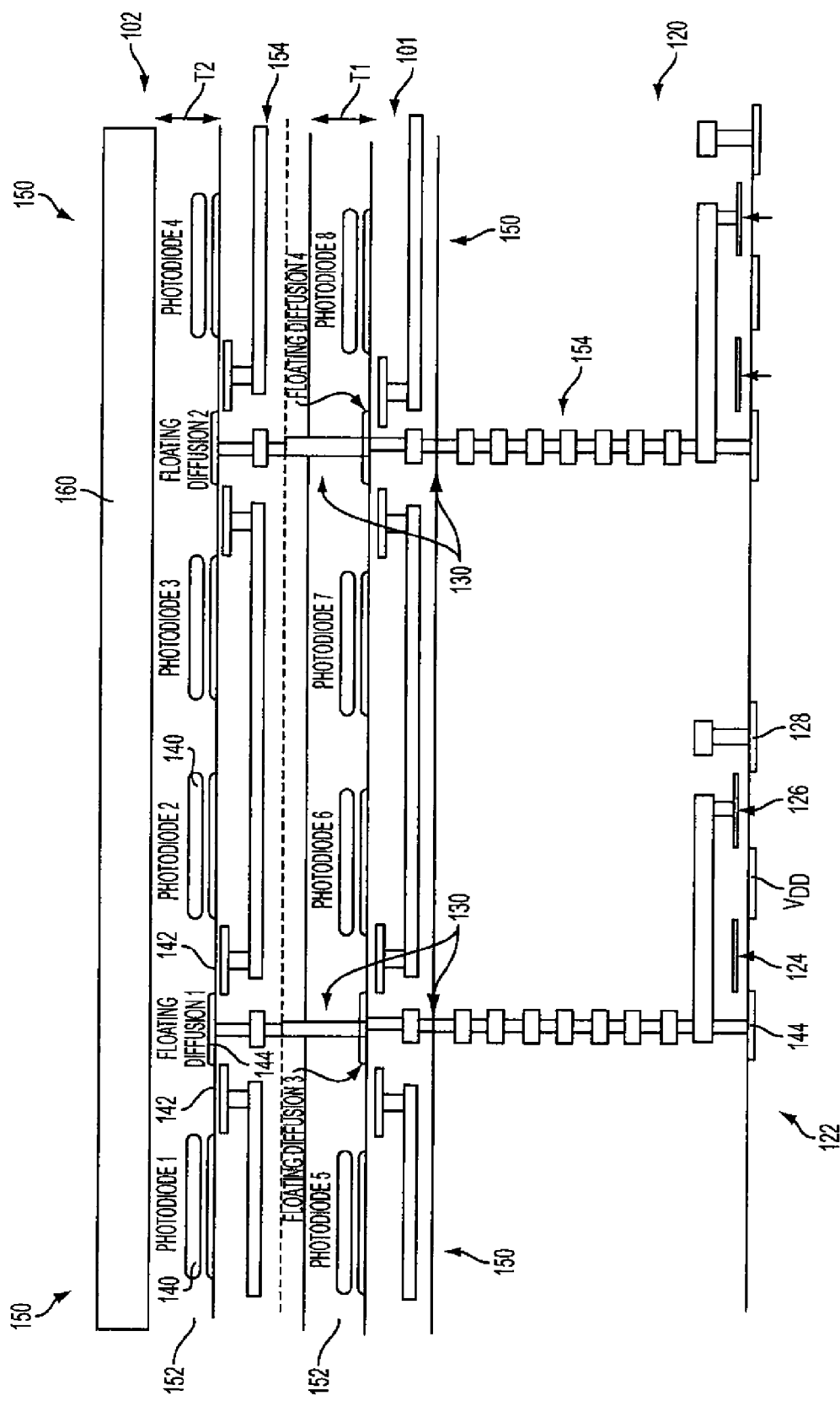
FIG. 5 is a section view illustrating an embodiment of an image sensor.

FIG. 5 is a cross-section view showing further aspects of an embodiment of an image sensor having two sensor layers 101,102 and a circuit layer 120. Each of the sensor layers 101, 102 and the circuit layer 120 include a silicon portion 152 and one or more metal layers 154. The support circuitry 122 of the circuit layer 120 includes a floating diffusion 144 corresponding to each pixel kernel 150, and coupled to the corresponding pixel kernel by the interlayer connectors 130. The structure illustrated in FIG. 5 has an extra metal layer 154 (the metal layer corresponding to the transfer gate 142) and the wafer interconnection 130 is done through the floating diffusions 144. This allows binning the pixels onto the same floating diffusion 144.

Among other things, the support circuitry 122 also includes a reset gate 124, a voltage supply VDD, and a source follower input and output 126, 128 for each pixel kernel 150. In embodiment illustrated in FIG. 5, the interlayer connectors 130 electrically connect the respective floating diffusions nodes 144 on sensing layer T2, sensing layer T1, and the circuit wafer to form a collective floating diffusion 144.

In general, reducing the thickness of the silicon portion 152 can result in optical interference, which in turn can degrade quantum efficiency. To mitigate this effect and improve quantum efficiency, antireflection coatings are used on both sides of each of the sensing layers and on top on the circuit layer in some embodiments. Such antireflection coatings are known, and are used, for example, for single layer structures such as ONO stacks (silicon oxide-silicon nitride-silicon oxide) or hafnium oxide-magnesium oxide stacks. Other suitable antireflection coatings could also be used. These antireflection coatings can be deposited using any typical deposition technique before the sensing and the circuit layer are bonded together.

Figure 6:
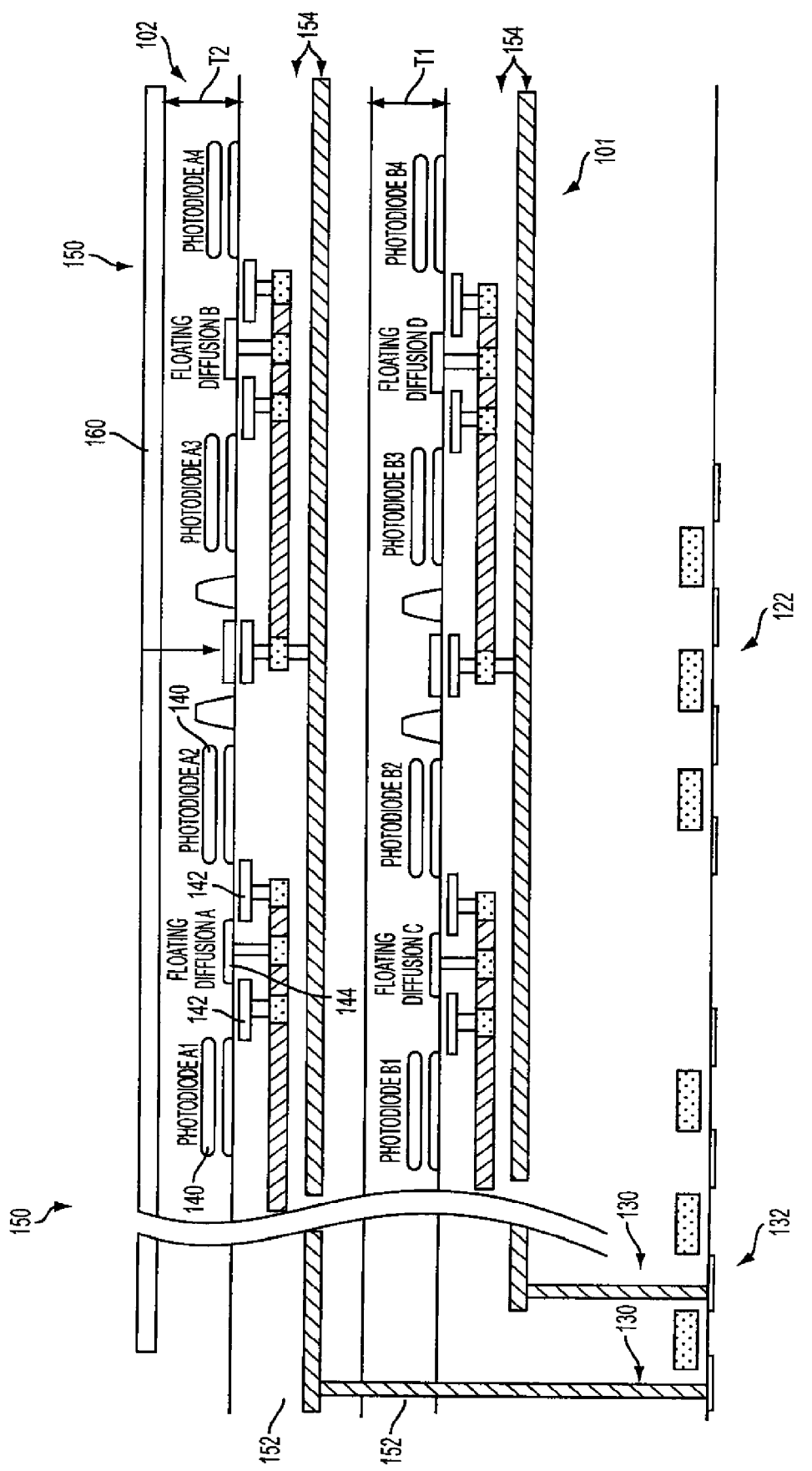
FIG. 6 is a section view illustrating another embodiment of an image sensor.

FIG. 6 illustrates another embodiment where the interlayer connections 130 are implemented by row and column interconnects, which connect the pixels 111 to the circuit layer 120 via row and column circuitry 132. An extra two metal layers 154 are included and the wafer interconnections 130 are done through row and column interconnects placed at the periphery of the imager area. Thus, each output signal and timing line on the sensor layers are electrically coupled with the interconnects 130 to the column or row circuitry 132 on the circuit layer 120. In the illustrated embodiments, standard CMOS digital and analog circuitry is situated outside the image area on sensor layers 101, 102 and/or the circuit wafer 120.

In the embodiments illustrated in FIGS. 5 and 6, a color filter array (CFA) 160 is situated over the top sensor layer 102. The silicon portions 152 or the first and second sensor layers 101,102 have different thicknesses T1,T2 so that each layer collects light with in a predetermined range of wavelengths. For instance, the thickness of the sensor layers can be about 0.5 μm to collect predominantly blue light, about 1.3 μm to collect predominantly green light, and/or about 3.0 μm to collect predominantly red light. By using the first and second thicknesses T1, T2 set to collect two predetermined colors, the need for some layers of the CFA 160 are eliminated.

Figure 7:
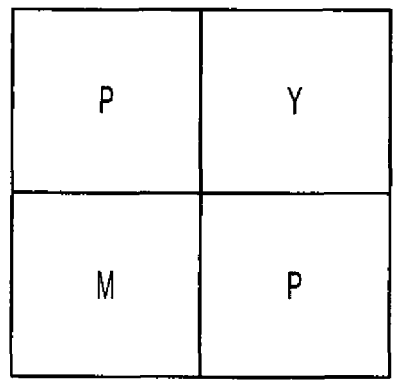
FIGS. 7 and 8 illustrate examples of color filter arrays.
Figure 8:
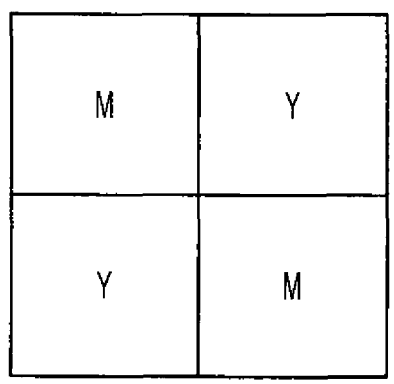

More specifically, the embodiments illustrated in FIGS. 5 and 6 having two sensor layers 101, 102 with layer thicknesses T1, T2 eliminates the need for two of the layers of the CFA 160. FIGS. 7 and 8 illustrate examples of two complementary CFAs 160, where Y stands for yellow, M stands for magenta and P stands for panchromatic. The silicon thickness T2 of the top sensor layer 102 is about 2 μm in the illustrated embodiments.

Figure 9:
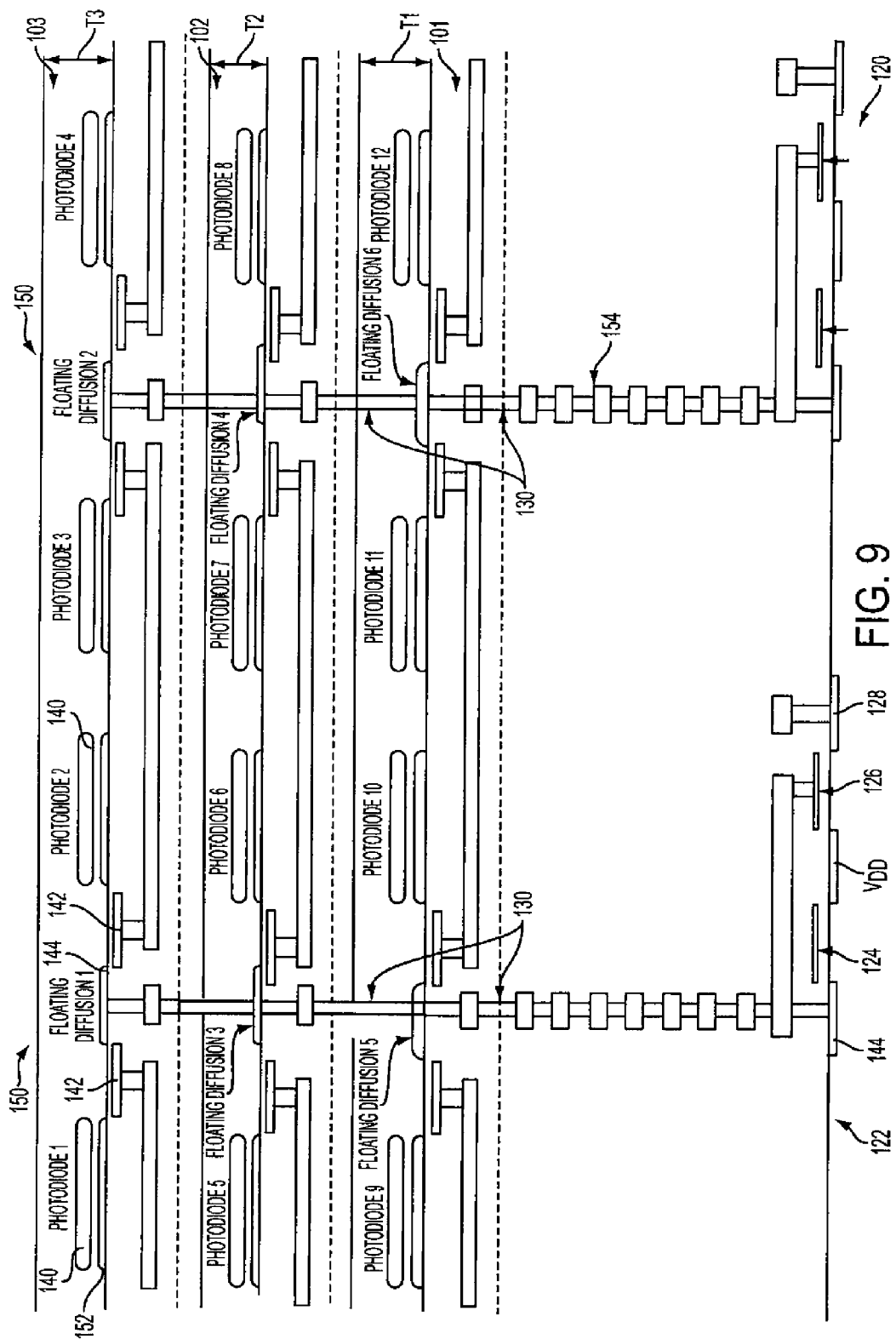
FIG. 9 is a section view illustrating another embodiment of an image sensor.
Figure 10:
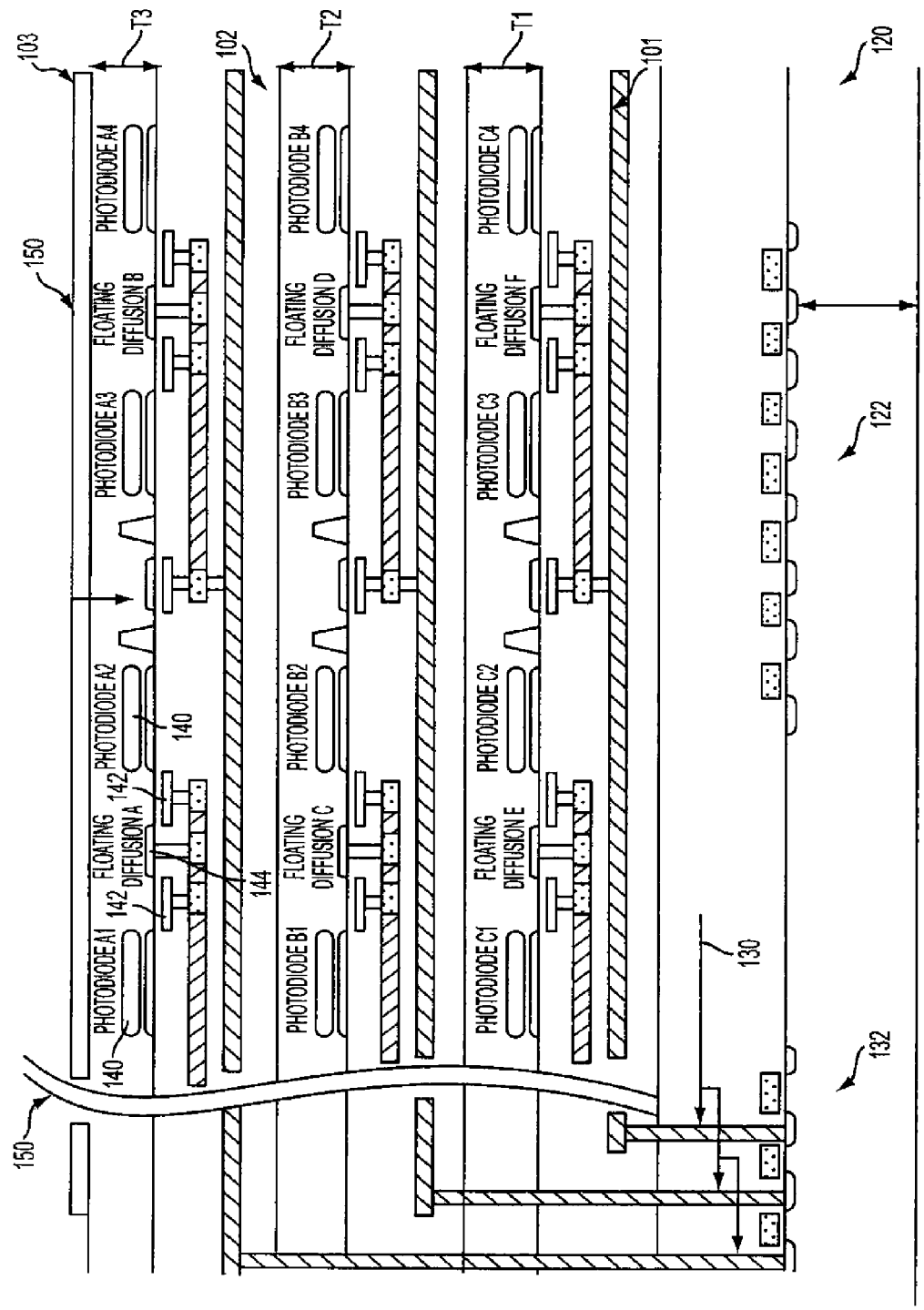
FIG. 10 is a section view illustrating a further embodiment of an image sensor.

The embodiments illustrated in FIGS. 9 and 10 each include an additional sensor layer 103. In FIG. 9, the interlayer connections 130 connect the floating diffusions 144, and in FIG. 10, the interlayer connections 130 are made using the row and column circuitry 132. In FIGS. 9 and 10, the silicon thickness T3 of the third sensor layer is about 0.5 μm so that it collects predominantly blue light, the silicon thickness T2 of the second sensor layer 102 is about 1.3 μm so that it collects predominantly green light, and the silicon thickness T1 of the first sensor layer is about 3 μm so that it collects predominantly red light. Such a sensor does not require wavelength selective filters to detect color, which are known to decrease quantum efficiency.

Figure 11:
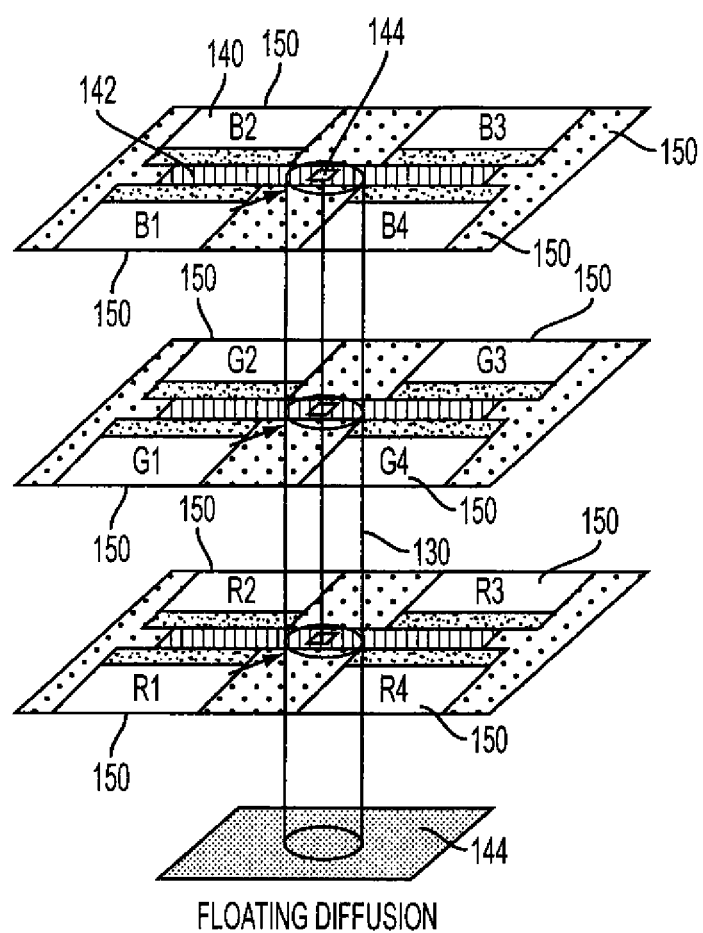
FIG. 11 conceptually illustrates an example of binning pixels in embodiments of an image sensor.

This structure also allows multiple ways of binning pixels onto a common floating diffusion. Depending on the number of photodiodes 140 within each pixel kernel 150, three or more photodiodes 140 can be connected to the same electrical interconnect 130. This allows multiple ways of binning the pixels 110. For example, as illustrated in FIG. 11, the transfer gates 142 for photodiodes B1, G1, and R1 can be activated to transfer charge onto the common floating diffusion 142 and produce a binned panchromatic signal. Similarly, on a single color layer, transfer gates 142 for each photodiode 110 in the pixel kernel 150 can be activated to bin all of the color signals and produce a higher sensitivity output at lower spatial resolution. For example, binning all four of the red pixels R1+R2+R3+R4 functions like a single large (high sensitivity) red pixel. The option also exists to sacrifice spatial resolution for color response in one color plane, but not others. For example, the four red pixels could be binned together, but individual photodiode data preserved in the green channel. Another option would be to bin all photodiodes (for example using all 12 photodiodes in FIG. 11 (four blue pixels B1-B4, four green pixels G1-G4, and four red pixels R1-R4) onto the shared floating diffusion 144. This would produce a high sensitivity, low spatial resolution panchromatic signal for the stacked kernel. Color separation in this case would be accomplished by preserving color separation in nearby kernels.

Figure 12:
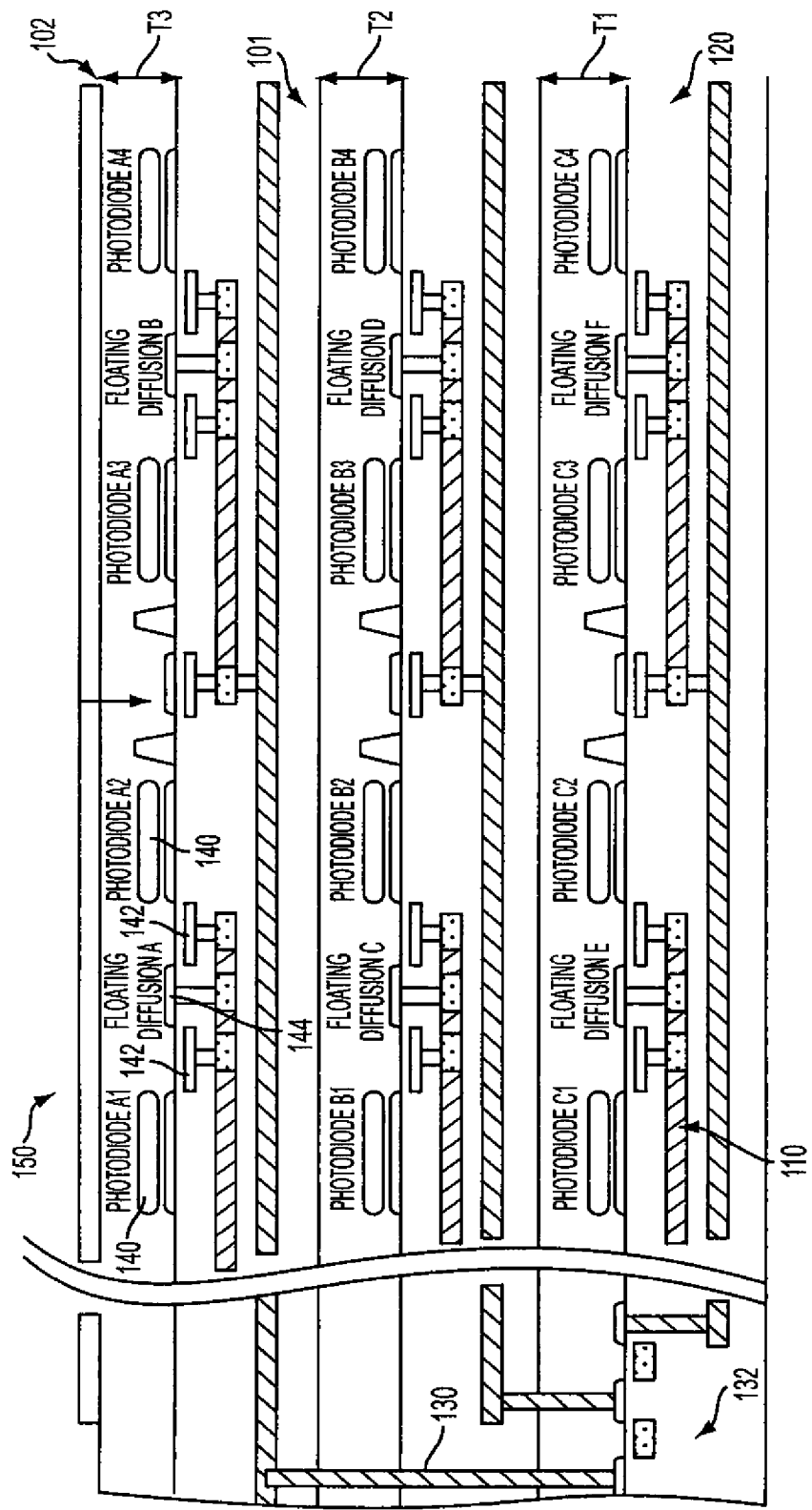
FIG. 12 is a section view illustrating another embodiment of an image sensor.

FIG. 12 illustrates another embodiment that includes two sensor layers 101,102 and a circuit layer 120 that also contains sensing elements. This structure requires one less wafer as compared to the embodiments illustrated in FIGS. 9 and 10 while still providing three sensor layers. Thus, the circuit layer 120 includes pixels 110 in addition to support circuitry. The silicon thickness T1,T2,T3 circuit layer 120 and the two sensor layers 101,102 are such that each layer collects light with predetermined ranges of wavelengths. In FIG. 12, the interlayer connections 130 are made through the row and column circuitry 132, though in similar embodiments the connections are made through the floating diffusions 144.

Figure 13:
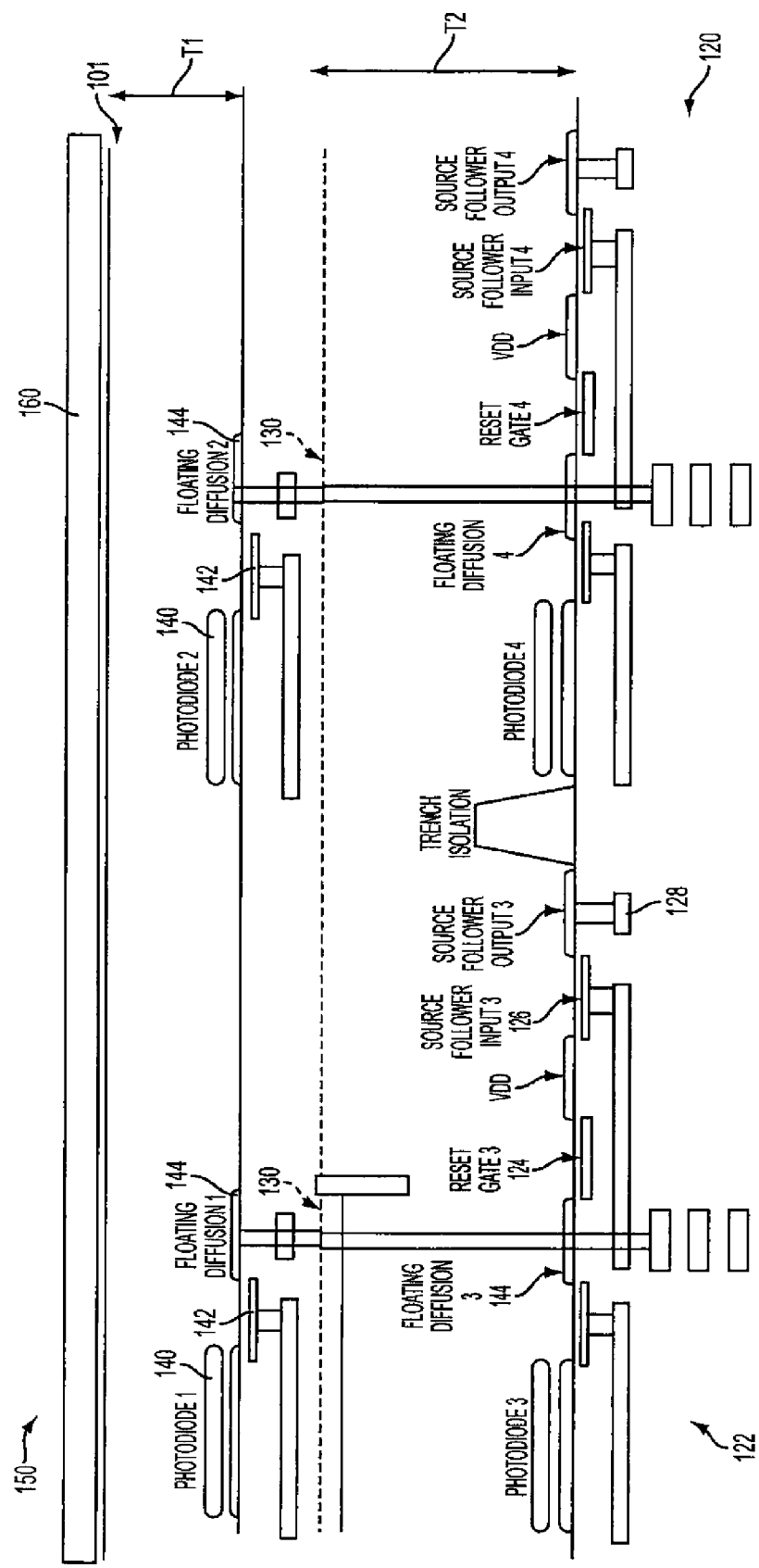
FIG. 13 is a section view illustrating another embodiment of an image sensor.

FIG. 13 illustrates an embodiment having one sensor layer 101 and a circuit layer 120 that also includes sensing elements. The embodiment illustrated in FIG. 113 has interlayer connections 130 through the floating diffusions 144, though the connections can alternatively be made through the row and column circuitry as disclosed in other embodiments herein. The sensor layer 101 and the circuit layer 120 each have silicon thicknesses T1,T2 to layer collect light with predetermined ranges of wavelengths. As with the embodiments illustrated in FIGS. 5 and 6, a complementary CFA 160 such as illustrated in FIGS. 7 and 8 is provided for filtering the third color.

Figure 14:
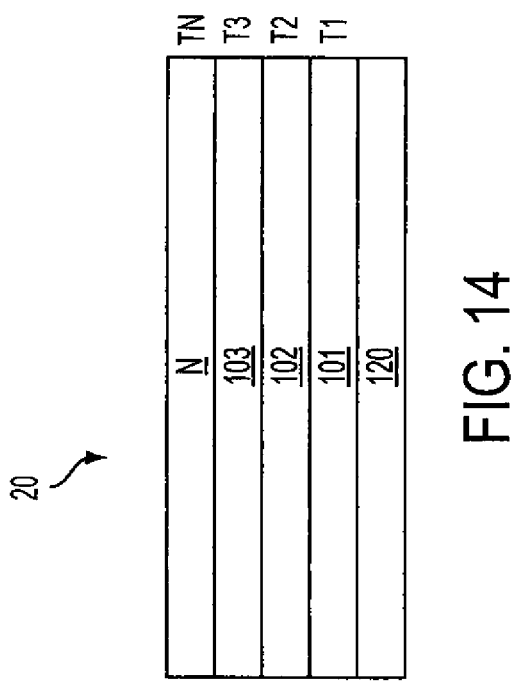
FIG. 14 is a block diagram conceptually illustrating another embodiment of an image sensor.

FIG. 14 conceptually illustrates another embodiment having more than three sensing layers 101-N, with each layer having a predetermined thickness for collecting light having corresponding ranges of wavelengths. This structure allows the extension of sensitivity beyond the visible spectrum. The top three layers will be responsible for capturing the light in the visible frequency range as described, for example, in the embodiments illustrated in FIGS. 9 and 10, while the extra layers N may be used to capture infrared light The invention has been described in detail with particular reference to certain preferred embodiments thereof, but it will be understood that variations and modifications can be effected within the spirit and scope of the invention.

PARTS LIST 10 light
11 imaging stage
12 lens
13 ND filter block
14 iris block
16 brightness sensor block
18 shutter block
20 image sensor
22 analog signal processor
24 analog to digital (A/D) converter
26 timing generator
28 image sensor stage
30 bus
32 memory
36 digital signal processor (DSP)
38 processing stage
40 exposure controller
50 system controller
52 bus
54 program memory
56 system memory
57 host interface
60 memory card interface
62 socket
64 memory card
70 viewfinder display
72 exposure display
74 user inputs
76 status display
80 video encoder
82 display controller
88 image display
101 first sensor layer
102 second sensor layer
103 third sensor layer
110 pixel
111 first pixel array
112 second pixel array
120 circuit layer
122 support circuitry
124 reset gate
126 source follower input
128 source follower output
130 interlayer connectors
132 row and column circuitry
140 photodiode
142 transfer gate
144 floating diffusion
150 pixel kernel
152 silicon layer
154 metal layer
160 color filter array (CFA)
T1 first thickness
T2 second thickness
T3 third thickness
$V_{DD}$ voltage supply

The invention claimed is:

1. An image sensor, comprising:
a first sensor layer having a first array of pixels, each pixel including a photodetector for collecting charge in response to incident light, a charge-to-voltage conversion mechanism, and a transfer gate for selectively transferring charge from the photodetector to the charge-to-voltage mechanism, the first sensor layer having a thickness to collect light with a first preselected range of wavelengths;
a second sensor layer situated over the first sensor layer, the second sensor layer having a second array of pixels, each pixel including a photodetector for collecting charge in response to incident light, a charge-to-voltage conversion, and a transfer gate for selectively transferring charge from the photodetector to the charge-to-voltage mechanism, the second sensor layer being of the same material as the first sensor layer and having a thickness to collect light with a second preselected range of wavelengths;
a color filter array situated over the second sensor layer, wherein the color filter array excludes portions that filter out at least one of the first preselected range of wavelengths and the second preselected range of wavelengths;
a circuit layer separate from the first and second sensor layers and situated below the first sensor layer, the circuit layer having support circuitry for the pixels of the first and second sensor layers; and
interlayer connectors between the pixels of the first and second layers and the support circuitry.

2. The image sensor of claim 1, wherein the circuit layer includes a charge-to-voltage conversion mechanism coupled to the charge-to-voltage mechanisms of the first and second sensor layer.

3. The image sensor of claim 1, wherein a plurality of photodiodes are connected to a common charge-to-voltage mechanism.

4. The image sensor of claim 1, wherein the circuit layer includes a charge-to-voltage mechanism, and wherein the interlayer connections are connected between charge-to-voltage mechanisms of the first and second sensor layers and the circuit layer.

5. The image sensor of claim 1, further comprising row and column select circuitry that provides the interlayer connections.

6. The image sensor of claim 1, wherein the first sensor layer and the circuit layer are combined in a single layer having the first array of pixels and the support circuitry.

7. An image sensor, comprising:
a first sensor layer having a first array of pixels, each pixel including a photodetector for collecting charge in response to incident light, a charge-to-voltage conversion mechanism, and a transfer gate for selectively transferring charge from the photodetector to the charge-to-voltage mechanism, the first sensor layer having a thickness to collect light with a first preselected range of wavelengths;
a circuit layer of the same material as the first sensor layer and situated below the first sensor layer, the circuit layer having a second array of pixels, each pixel including a photodetector for collecting charge in response to incident light, a charge-to-voltage conversion, and a transfer gate for selectively transferring charge from the photodetector to the charge-to-voltage mechanism, support circuitry for the first and second arrays of pixels,
wherein the circuit layer has a thickness to collect light with a second preselected range of wavelengths;
interlayer connectors between the pixels of the first and second layers and the support circuitry; and
a color filter array situated over the first sensor layer, wherein the color filter array excludes portions that filter out at least one of the first preselected range of wavelength and the second preselected range of wavelengths.

8. The image sensor of claim 7, wherein the interlayer connections are connected between the charge-to-voltage mechanisms of the first sensor layer and the circuit layer.

9. The image sensor of claim 7, further comprising row and column select circuitry that provides the interlayer connections.

10. A method of binning pixels of an image sensor, comprising:
providing a first pixel kernel situated in a first layer, the first pixel kernel including a first charge-to-voltage mechanism;
providing a second pixel kernel situated in a second layer above the first layer, the second layer including a second charge-to-voltage mechanism and being of the same material as the first layer;
transferring a first charge from a pixel of the first pixel kernel to the first charge-to-voltage mechanism;
transferring a second charge from a pixel of the second pixel kernel to the second charge-to-voltage mechanism; and
transferring the first and second charges via interlayer connections from the first and second charge-to-voltage mechanisms to a common charge-to-voltage mechanism formed on a circuit layer below the first layer.

11. The method of claim 10, further comprising:
providing a third pixel kernel situated in a third layer above the second layer;
transferring a third charge from a pixel of the third pixel kernel to a third charge-to-voltage mechanism; and
transferring the first, second and third charges to the common charge-to-voltage mechanism.

12. The method of claim 10, wherein transferring the first charge includes transferring a plurality of charges from a plurality of pixels to the first charge-to-voltage mechanism.

13. An image sensor comprising:
a first pixel kernel situated in a first layer, the first pixel kernel including two or more pixels having a first shared charge-to-voltage mechanism;
a second pixel kernel situated in a second layer above the first layer, the second pixel kernel including two or more pixels having a second shared charge-to-voltage mechanism, and the second layer being of the same material as the first layer; and
a common charge-to-voltage mechanism formed on a circuit layer below the first layer, wherein the common charge-to-voltage mechanism is coupled via interlayer connections to the first and second shared charge-to-voltage mechanisms.

14. The method of claim 13, further comprising:
a third pixel kernel situated in a third layer above the second layer, the third pixel kernel including two or more pixels having a third shared charge-to-voltage mechanism; and
an interlayer connection from the third shared charge-to-voltage mechanism to the first and second shared charge-to-voltage mechanisms.

15. An image sensor comprising:
a first sensor layer having a first array of pixels, each pixel including a photodetector for collecting charge in response to incident light, a charge-to-voltage conversion mechanism, and a transfer gate for selectively transferring charge from the photodetector to the charge-to-voltage mechanism, the first sensor layer having a thickness to collect light with a first preselected range of wavelengths;
a second sensor layer situated over the first sensor layer, the second sensor layer having a second array of pixels, each pixel including a photodetector for collecting charge in response to incident light, a charge-to-voltage conversion, and a transfer gate for selectively transferring charge from the photodetector to the charge-to-voltage mechanism, the second sensor layer being of the same material as the first sensor layer and having a thickness to collect light with a second preselected range of wavelengths;
an absorptive color filter array filter situated over the second sensor layer;
a circuit layer separate from the first and second sensor layers and situated below the first sensor layer, the circuit layer having support circuitry for the pixels of the first and second sensor layers; and
interlayer connectors between the pixels of the first and second layers and the support circuitry.

16. The image sensor of claim 15, wherein the circuit layer includes a charge-to-voltage conversion mechanism coupled to the charge-to-voltage mechanisms of the first and second sensor layer.

17. The image sensor of claim 15, wherein a plurality of photodetectors are connected to a common charge-to-voltage mechanism.

18. The image sensor of claim 15, wherein the circuit layer includes a charge-to-voltage mechanism, and wherein the interlayer connections are connected between charge-to-voltage mechanisms of the first and second sensor layers and the circuit layer.

19. The image sensor of claim 15, further comprising row and column select circuitry that provides the interlayer connections.

20. The image sensor of claim 15, wherein the first sensor layer and the circuit layer are combined in a single layer having the first array of pixels and the support circuitry.

21. An image sensor, comprising:
- a first sensor layer having a first array of pixels, each pixel including a photodetector for collecting charge in response to incident light, a charge-to-voltage conversion mechanism, and a transfer gate for selectively transferring charge from the photodetector to the charge-to-voltage mechanism, the first sensor layer having a thickness to collect light with a first preselected range of wavelengths;
- a circuit layer of the same material as the first sensor layer and situated below the first sensor layer, the circuit layer having a second array of pixels, each pixel including a photodetector for collecting charge in response to incident light, a charge-to-voltage conversion, and a transfer gate for selectively transferring charge from the photodetector to the charge-to-voltage mechanism, support circuitry for the first and second arrays of pixels; and
- wherein the circuit layer has a thickness to collect light with a second preselected range of wavelengths;
- interlayer connectors between the pixels of the first and second layers and the support circuitry; and
- an absorptive color filter array situated over the first sensor layer.

22. The image sensor of claim 21, wherein the interlayer connections are connected between the charge-to-voltage mechanisms of the first sensor layer and the circuit layer.

23. The image sensor of claim 21, further comprising row and column select circuitry that provides the interlayer connections.

* * * * *